(12) United States Patent
Chang et al.

(10) Patent No.: US 10,263,199 B2
(45) Date of Patent: Apr. 16, 2019

(54) DISPLAY DEVICE INCLUDING A BENDING REGION AND NON-BENDING REGIONS

(71) Applicant: SAMSUNG DISPLAY CO., LTD., Yongin-si, Gyeonggi-Do (KR)

(72) Inventors: Seung Wook Chang, Suwon-si (KR); Young Hee Lee, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/868,424

(22) Filed: Sep. 29, 2015

(65) Prior Publication Data
US 2016/0240801 A1    Aug. 18, 2016

(30) Foreign Application Priority Data

Feb. 13, 2015 (KR) ........................ 10-2015-0022415

(51) Int. Cl.
| | | |
|---|---|---|
| *H01L 51/00* | (2006.01) | |
| *H01L 51/50* | (2006.01) | |
| *H01L 51/52* | (2006.01) | |
| *H01L 27/32* | (2006.01) | |

(52) U.S. Cl.
CPC ...... *H01L 51/0097* (2013.01); *H01L 51/5012* (2013.01); *H01L 27/3244* (2013.01); *H01L 2251/5338* (2013.01); *H01L 2251/558* (2013.01); *Y02E 10/549* (2013.01)

(58) Field of Classification Search
CPC ......... H01L 51/00; H01L 51/50; H01L 51/52; H01L 27/32

USPC .............................. 257/59, 40; 362/418, 660
See application file for complete search history.

(56) References Cited

U.S. PATENT DOCUMENTS

| | | | | |
|---|---|---|---|---|
| 6,024,791 | A * | 2/2000 | Sonoda | .................. C04B 28/02 106/714 |
| 2007/0032632 | A1* | 2/2007 | Tsukioka | ............... C08G 61/10 528/394 |
| 2010/0207514 | A1* | 8/2010 | Tanaka | ............... H01L 51/5036 313/504 |
| 2010/0308335 | A1* | 12/2010 | Kim et al. | ....................... 257/59 |
| 2011/0134144 | A1* | 6/2011 | Moriwaki | ..................... 345/660 |
| 2011/0176092 | A1* | 7/2011 | Iida | ...................... C08G 63/193 349/96 |
| 2011/0183454 | A1* | 7/2011 | Jou | ..................... H01L 51/0004 438/34 |
| 2013/0005211 | A1* | 1/2013 | Shin | .................... H01L 27/3211 445/24 |
| 2013/0056247 | A1* | 3/2013 | Yoshioka et al. | ............. 174/251 |

(Continued)

FOREIGN PATENT DOCUMENTS

| | | |
|---|---|---|
| KR | 10-2005-0048705 A | 5/2005 |
| KR | 10-2011-0065062 A | 6/2011 |
| KR | 10-2012-0089077 A | 8/2012 |

*Primary Examiner* — Sheng-Bai Zhu
(74) *Attorney, Agent, or Firm* — Lee & Morse, P.C.

(57) ABSTRACT

A display device, including a substrate having a first region and second regions; transistors on the substrate in the first region and the second regions; first electrodes each connected to the transistors; an organic emission layer on the first electrodes; and second electrodes on the organic emission layer, molecular weights of organic materials of the organic emission layer in the first region and the organic emission layer in the second regions being different from each other.

11 Claims, 6 Drawing Sheets

(56) References Cited

U.S. PATENT DOCUMENTS

| | | | |
|---|---|---|---|
| 2013/0169515 A1* | 7/2013 | Prushinskiy | G06F 1/1652 |
| | | | 345/55 |
| 2013/0343012 A1* | 12/2013 | Park | H05K 7/1417 |
| | | | 361/750 |
| 2014/0042406 A1* | 2/2014 | Degner | H01L 27/326 |
| | | | 257/40 |
| 2014/0098549 A1* | 4/2014 | Hack et al. | 362/418 |
| 2014/0183492 A1* | 7/2014 | Park et al. | 257/40 |
| 2014/0240985 A1* | 8/2014 | Kim | H05K 1/028 |
| | | | 362/249.04 |
| 2015/0162392 A1* | 6/2015 | Lim | H01L 27/3244 |
| | | | 257/72 |
| 2015/0382446 A1* | 12/2015 | Kwon et al. | 257/59 |

* cited by examiner

DISPLAY DEVICE INCLUDING A BENDING REGION AND NON-BENDING REGIONS

CROSS-REFERENCE TO RELATED APPLICATION

Korean Patent Application No. 10-2015-0022415, filed on Feb. 13, 2015, in the Korean Intellectual Property Office, and entitled: "Display Device," is incorporated by reference herein in its entirety.

BACKGROUND

1. Field

The present disclosure relates to a display device.

2. Description of the Related Art

A display device may be replaced by a portable thin flat panel display device. Application and use of flexible display devices, that may be bent or folded when a user wants to bend or fold the display device, or flexible display devices including a bending or folding operation in a manufacturing process, may increase, and flexible display panels may become prominent.

SUMMARY

Embodiments may be realized by providing a display device, including a substrate having a first region and second regions; transistors on the substrate in the first region and the second regions; first electrodes each connected to the transistors; an organic emission layer on the first electrodes; and second electrodes on the organic emission layer, molecular weights of organic materials of the organic emission layer in the first region and the organic emission layer in the second regions being different from each other.

The first region may be a bending region, and the second regions may be non-bending regions.

The bending region may be a region folded or bent based on a reference line.

The non-bending regions may include first and second non-bending regions, and the first and second non-bending regions may be at opposite sides of the bending region.

The molecular weight of an organic material in the first region may be higher than the molecular weight of organic materials in the second regions.

An emission layer of the first region may be formed by a solution process, and an emission layer of the second regions may be formed by a deposition process.

The organic emission layer may include a hole-injection layer, a hole-transporting layer, an emission layer, an electron-transporting layer, and an electron-injection layer.

The hole-injection layer, the hole-transporting layer, the electron-transporting layer, and the electron-injection layer may be over an entirety of the substrate.

Among the second electrodes, a second electrode in the first region and a second electrode in the second regions may have different thicknesses.

The second electrode in the first region may have a thinner thickness than a thickness of the second electrode in the second regions.

Embodiments may be realized by providing a display device, including a substrate having a first region and second regions; transistors on the substrate in the first region and the second regions; first electrodes each connected to the transistors; an organic emission layer on the first electrodes; and second electrodes on the organic emission layer. Among the second electrodes, a second electrode in the first region may have a thinner thickness than a thickness of a second electrode in the second regions.

The first region may be a bending region, and the second regions may be non-bending regions.

The bending region may be a region folded or bent based on a reference line.

The non-bending regions may include first and second non-bending regions, and the first and second non-bending regions may be at opposite sides of the bending region.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
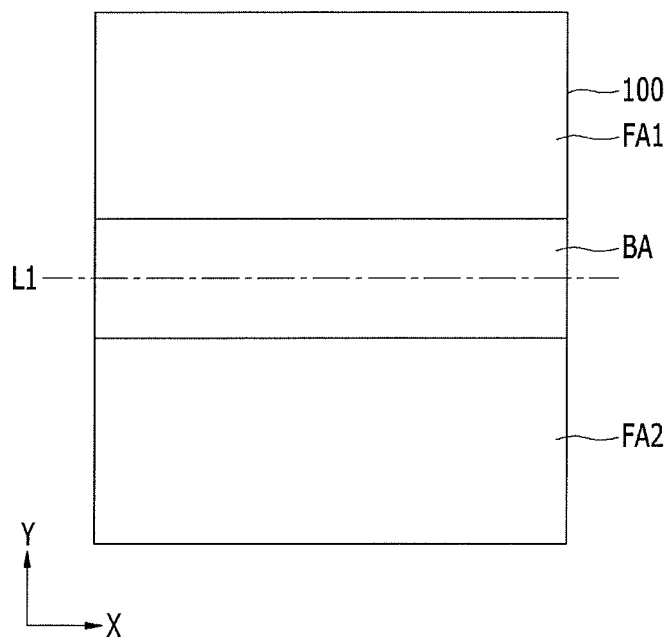
FIG. 1 illustrates a schematic plan view of a display device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Portions unrelated to the description will be omitted in order to obviously describe the present disclosure, and similar components will be denoted by the same reference numerals throughout the present specification.

In addition, since sizes and thicknesses of the respective components shown in the accompanying drawings may be arbitrarily shown for convenience of explanation, the present disclosure is not necessarily limited to contents shown in the accompanying drawings.

In the drawings, the thickness of layers, films, panels, regions, etc., may be exaggerated for clarity. In addition, in the accompanying drawings, thicknesses of some of layers and regions have been exaggerated for convenience of explanation. It will be understood that when an element such as a layer, a film, a region, or a substrate is referred to as being "on" another element, it may be directly on another element or may have an intervening element present therebetween. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In addition, throughout the present specification, unless explicitly described to the contrary, the word "comprise" and variations such as "comprises" or "comprising", will be understood to imply the inclusion of stated elements but not the exclusion of any other elements. In addition, throughout the specification, the word "on" does not necessarily mean that any element is positioned at an upper side based on a gravity direction, but means that any element is positioned above or below a target portion.

Figure 2:
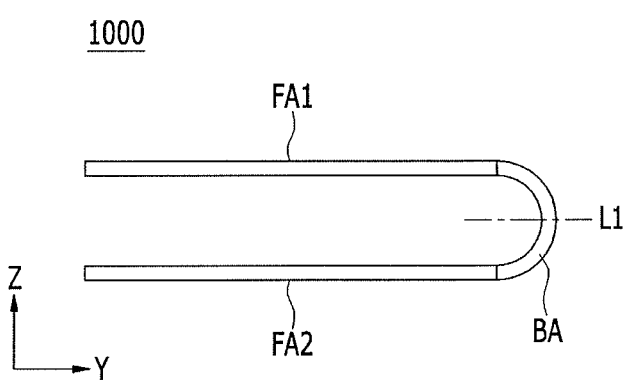
FIG. 2 illustrates a schematic side view of a state in which the display device of FIG. 1 is folded.
Figure 3:
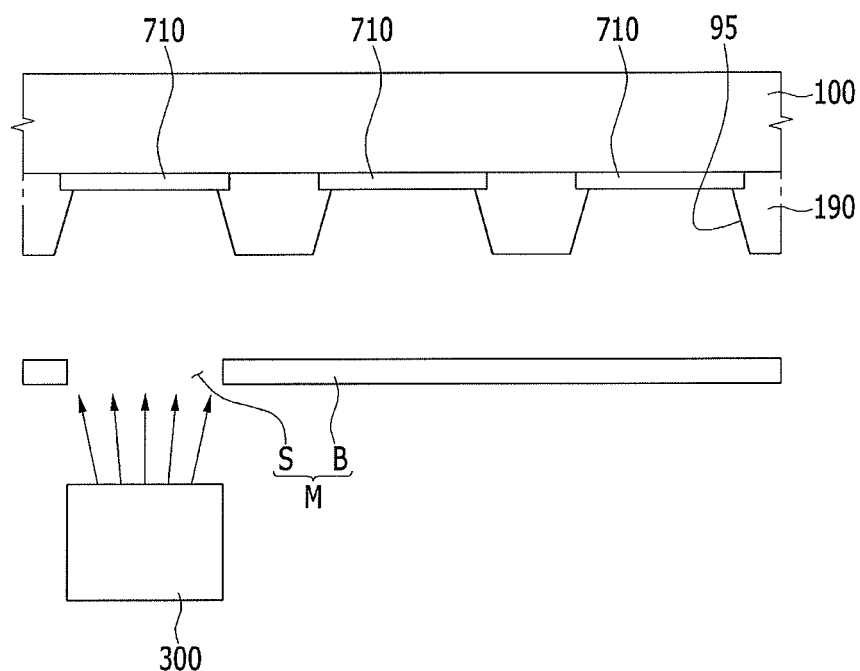
FIG. 3 illustrates a schematic view for describing a deposition process according to an exemplary embodiment of the present disclosure.

FIG. 1 illustrates a schematic plan view of a display device according to an exemplary embodiment of the present disclosure, FIG. 2 illustrates a schematic side view of a state in which the display device of FIG. 1 is folded, and FIG. 3 illustrates a schematic view for describing a deposition process according to an exemplary embodiment of the present disclosure.

Referring to FIGS. 1 and 2, the display device 1000 may include a substrate 100 in which a bending region BA and non-bending regions FA1 and FA2 are defined.

The bending region BA, which may be a region including a reference line L1, may be folded or bent in both directions based on the reference line L1. As shown in FIG. 2, the bending region BA may have a curved region, which may be symmetrical based on the reference line L1. Only one bending region BA is shown in FIGS. 1 and 2. In an embodiment, a plurality of bending regions may be formed between the non-bending regions.

The non-bending regions FA1 and FA2 may include a first non-bending region FA1 and a second non-bending region FA2. The first non-bending region FA1 and the second non-bending region FA2 may be positioned at both sides based on, e.g., on opposites of, the bending region BA.

The non-bending regions FA1 and FA2 may be flat regions without being curved, and the first non-bending region FA1 and the second non-bending region FA2 may face each other when the bending region is folded or bent.

The bending region BA and the non-bending regions FA1 and FA2 may include a plurality of pixels.

Each of the pixels may include an organic light emitting diode, and an emission layer of the organic light emitting diode may include organic materials having different molecular weights depending on positions.

A molecular weight of organic materials of the emission layer positioned in the bending region BA may be higher than those of organic materials of the emission layer positioned in the non-bending regions FA1 and FA2.

The emission layer positioned in the bending region BA may be an emission layer formed using an organic material having a molecular weight higher than those of the organic materials of the emission layer positioned in the non-bending regions FA1 and FA2, by a solution process. The solution process may be, for example, a spin coating method, a slit coating method, a drop casting method, a dip casting method, or an ink jet method. When the emission layer is formed by a method such as, for example, an ink jet method, the emission layer may be formed for each color without using a separate mask.

The emission layer positioned in the non-bending regions FA1 and FA2 may be an emission layer formed using organic materials having a molecular weight lower than that of the organic material of the emission layer positioned in the bending region BA, by a deposition method.

A material on which the deposition process may be performed may be used as the organic material having a low molecular weight, and the emission layer may include, for example, a phosphorescent host, a fluorescent host, a phosphorescent dopant, and a fluorescent dopant.

Examples of materials that may be used as hosts include, for example, (4,4'-bis(carbazol-9-yl)biphenyl) (CBP), (9,10-Di(naphth-2-yl) anthracene) (ADN), 1,3,5-tris(N-phenyl-benzimiazole-2-yl)benzene(TPBI), 2-tert-butyl-9,10-di (2-naphthyl)anthracene (TBADN), 1,3-bis(carbazol-9-yl) benzene (MCP), and 1,3,5-tris(carbazol-9-yl)benzene (TCP).

Examples of materials that may be used as a red dopant include, for example, Pt (II) octaethylporphine (PtOEP), Tris (1-phenylisoquinoline) iridium(III) (Ir(piq)$_3$), and Bis (2-benzo[b]thiophen-2-yl-pyridine(Ir(btp)$_2$(acac)).

Examples of materials that may be used as a green dopant include, for example, Tris (2-phenylpyridine)iridium(Ir (ppy)$_3$) and acetylacetonatobis (2-phenylpyridine)iridium(Ir (ppy)$_2$(acac)). Examples of materials that may be used as a blue dopant include, for example, bis[2-(4,6-difluorophenyl) pyridinato-N,C2']iridium picolinate (F$_2$Irpic), (F$_2$ppy)$_2$Ir (tmd), tris[1-(4,6-difluorophenyl)pyrazolate-N,C2']ridium) (Ir(dfppz)$_3$), 4,4'-Bis (2,2-diphenylvinyl)-1,1'-biphenyl) (DPVBi), 4,4-Bis[4-(di-p-tolylamino)styryl]biphenyl (DPAVBi), and 2,5,8,11-Tetra-tert-butylperylene (TBPe).

The deposition process may be performed using a mask having a slit S and a blocking part B, as shown in FIG. 3. The slit S of the mask M may be disposed to correspond to a first electrode 710 of any one pixel, and the other pixels may be disposed to correspond to the blocking part B of the mask M. Any one pixel refers to pixels in which organic materials having the same light emitting color are deposited.

Then, a deposition source 300 may be heated to emit organic materials in the deposition source 300 to the first electrode 710, and an emission layer 720 may be formed.

The organic material having a high molecular weight, which may be a material having a high solubility, may be a material on which the solution process may be performed, for example, a polyfluorene derivative, a (poly)paraphenylenevinylene derivative, a polyphenylene derivative, polyvinylcarbazole, a polythiophene derivative, poly (3,4-ethylenedioxythiophene):polystyrene sulfonate (PEDOT:PSS), polyanilin (PANT), polypyrrole, or compounds obtained by doping polymer materials thereof with a perylene based pigment, a cumarine based pigment, a rhodamine based pigment, rubrene, perylene, 9,10-diphenylanthracene, tetraphenylbutadiene, Nile red, coumarin, or quinacridone.

Next, one pixel of the display device according to an exemplary embodiment of the present disclosure will be described in detail with reference to the accompanying drawings.

Figure 4:
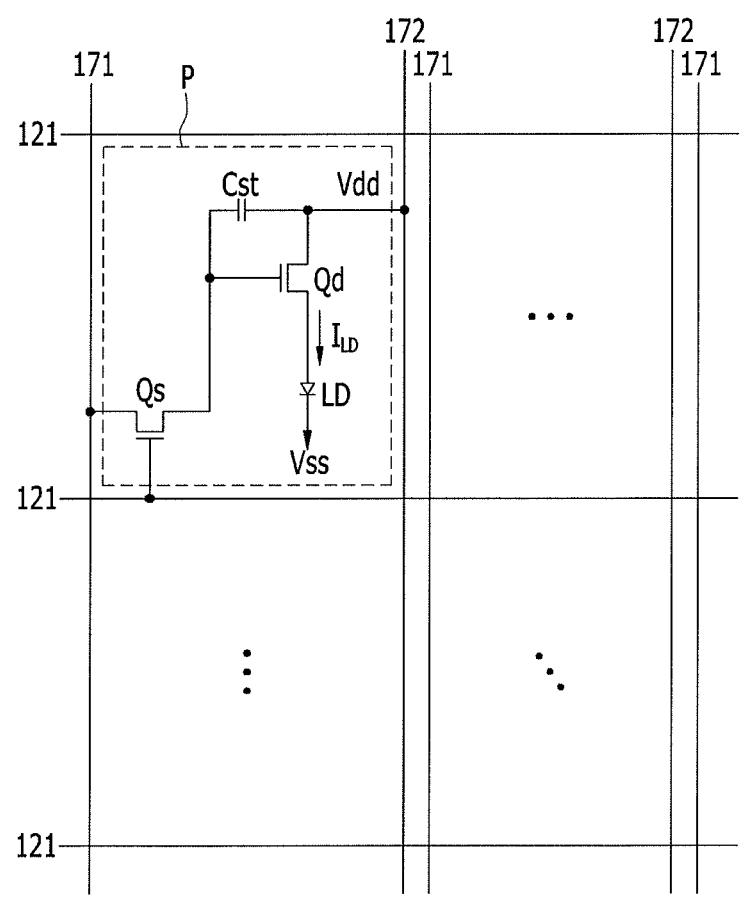
FIG. 4 illustrates an equivalent circuit diagram of one pixel formed in the display device shown in FIG. 1.
Figure 5:
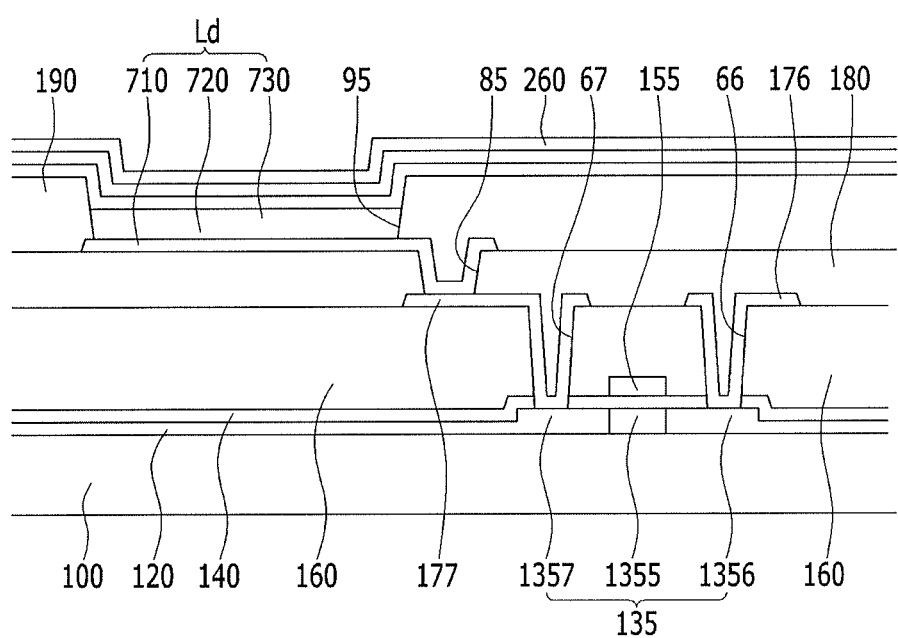
FIG. 5 illustrates a schematic cross-sectional view of one pixel formed in the display device shown in FIG. 1.

FIG. 4 illustrates an equivalent circuit diagram of one pixel formed in the display device shown in FIG. 1, and FIG. 5 illustrates a schematic cross-sectional view of one pixel formed in the display device shown in FIG. 1.

As shown in FIG. 4, the display device 1000 according to an exemplary embodiment of the present disclosure may include a plurality of signal lines 121 and 171, and a plurality of pixels P connected to the plurality of signal lines 121 and 171 and arranged approximately in a matrix form.

The signal lines may include a plurality of first signal lines 121 transferring gate signals (or scanning signals), a plurality of second signal lines 171 transferring data signals, and a plurality of third signal lines 172 transferring a driving voltage Vdd. The first signal lines 121 may extend approximately in a row direction and may be substantially parallel to each other, and the second signal lines 171 and the third signal lines 172 may extend in a column direction, may intersect the first signal lines 121, and may be substantially parallel to each other.

Each pixel P may include a driving thin film transistor Qd, a switching thin film transistor Qs, a storage capacitor Cst, and an organic light emitting diode (OLED) LD.

The driving thin film transistor Qd may have a control terminal, an input terminal, and an output terminal. The control terminal may be connected to the switching thin film transistor Qs, the input terminal may be connected to the third signal line 172, and the output terminal may be connected to the organic light emitting diode LD. The driving thin film transistor Qd may allow an output current $I_{LD}$, a magnitude of which may be changed depending on a voltage applied between the control terminal and the output terminal, to flow.

The switching thin film transistor Qs also may have a control terminal, an input terminal, and an output terminal. The control terminal may be connected to the first signal line 121, the input terminal may be connected to the second signal line 171, and the output terminal may be connected to the driving thin film transistor Qd. The switching thin film transistor Qs may transfer the data signal applied to the second signal line 171 to the driving thin film transistor Qd in response to the scanning signal applied to the first signal line 121.

The storage capacitor Cst may be connected between the control terminal and the input terminal of the driving thin film transistor Qd. The storage capacitor Cst may be charged with the data signal applied to the control terminal of the driving thin film transistor Qd and may maintain the data signal even after the switching thin film transistor Qs is turned off.

The organic light emitting diode LD may have an anode that may be connected to the output terminal of the driving thin film transistor Qd and a cathode that may be connected to the common voltage Vss. The organic light emitting diode LD may emit light at an intensity changed depending on the output current $I_{LD}$ of the driving thin film transistor Qd to display an image.

Configurations of each layer of the above-mentioned components will be described in more detail with reference to FIG. 5. The driving thin film transistor Qd and the organic light emitting diode LD of FIG. 4 will be mainly described in detail depending on a stacking sequence. Hereinafter, the driving thin film transistor Qd will be called a thin film transistor.

As shown in FIG. 5, an organic light emitting diode display device 1000 may include a substrate 100 and a buffer layer 120 formed on the substrate 100.

The buffer layer 120 may be formed of a single layer of a silicon nitride ($SiN_x$) or a dual-layer structure, in which a silicon nitride ($SiN_x$) and a silicon oxide ($SiO_x$) may be stacked. The buffer layer 120 may serve to planarize a surface and may prevent permeation of an undesired component, such as, an impurity or moisture.

A semiconductor 135 made of polysilicon may be formed on the buffer layer 120.

The semiconductor 135 may be divided into a channel region 1355, a source region 1356, and a drain region 1357, and each of the source region 1356 and the drain region 1357 may be formed at both sides of the channel region 1355. The channel region 1355 of the semiconductor may be made of polysilicon that is not doped with impurities, for example, may be an intrinsic semiconductor. The source region 1356 and the drain region 1357 may be made of polysilicon that is doped with conductive impurities, for example, may be impurity semiconductors. The impurities doped in the source region 1356 and the drain region 1357 may be a p-type impurity or an n-type impurity.

A gate insulating layer 140 may be formed on the semiconductor 135. The gate insulating layer 140 may be formed of a single layer or a multilayer including one or more of a tetra ethyl ortho silicate (TEOS), a silicon nitride, or a silicon oxide.

A gate electrode 155 may be formed on the semiconductor 135, and may overlap the channel region 1355.

The gate electrode 155 may be formed of a single layer or a multilayer made of a low resistance material such as Al, Ti, Mo, Cu, Ni, or an alloy thereof or a material robust to corrosion.

A first interlayer insulating layer 160 may be formed on the gate electrode 155. The first interlayer insulating layer 160 may be formed of a single layer or a multilayer made of for example, a tetra ethyl ortho silicate (TEOS), a silicon nitride, or a silicon oxide, similar to the gate insulating layer 140.

The first interlayer insulating layer 160 and the gate insulating layer 140 may have a source contact hole 66 and a drain contact hole 67 each exposing the source region 1356 and the drain region 1357, respectively.

A source electrode 176 and a drain electrode 177 may be formed on the first interlayer insulating layer 160. The source electrode 176 may be connected to the source region 1356 through the source contact hole 66, and the drain electrode 177 may be connected to the drain region 1357 through the drain contact hole 67.

The source electrode 176 and the drain electrode 177 may be formed of a single layer or a multilayer made of a low resistance material such as Al, Ti, Mo, Cu, Ni, or an alloy thereof or a material robust to corrosion For example, the source electrode 176 and the drain electrode 177 may be a triple layer of Ti/Cu/Ti, Ti/Ag/Ti, or Mo/Al/Mo.

The gate electrode 155, the source electrode 176, and the drain electrode 177, which may be a control electrode, an input electrode, and an output electrode of FIG. 3, respectively, may configure a thin film transistor together with the semiconductor 135. A channel of the thin film transistor may be formed in the semiconductor 135 between the source electrode 176 and the drain electrode 177.

A second interlayer insulating layer 180 may be formed on the source electrode 176 and the drain electrode 177. The second interlayer insulating layer 180 may include a contact hole 85 exposing the drain electrode 177.

The second interlayer insulating layer 180 may be formed of a single layer or a multilayer made of, for example, a tetra ethyl ortho silicate (TEOS), a silicon nitride, or a silicon oxide, similar to the first interlayer insulating layer, and may be made of a low-k organic material.

A first electrode 710 may be formed on the second interlayer insulating layer 180. The first electrode 710 may be electrically connected to the drain electrode 177 through the contact hole 85, and may be the anode of the organic light emitting diode of FIGS. 4 and 5.

The interlayer insulating layer may be formed between the first electrode 710 and the drain electrode 177 in an exemplary embodiment of the present disclosure. In an embodiment, the first electrode 710 may be formed on the same layer as a layer on which the drain electrode 177 is formed and may be formed integrally with the drain electrode 177.

A pixel definition layer 190 may be formed on the first electrode 710.

The pixel definition layer 190 may have an opening 95 exposing the first electrode 710. The pixel definition layer 190 may be formed of, for example, a resin such as, for example, a polyacrylate or a polyimide, or a silica based inorganic material.

An organic emission layer 720 may be formed in the opening 95 of the pixel definition layer 190.

The organic emission layer 720 may be formed of a multilayer including one or more of an emission layer, a hole-injection layer (HIL), a hole-transporting layer (HTL), an electron-transporting layer (ETL), or an electron-injection layer (EIL).

The organic emission layer 720 may include all of these layers, and the hole-injection layer may be positioned on the first electrode 710, which may be the anode, and the hole-transporting layer, the emission layer, the electron-transporting layer, and the electron-injection layer may be sequentially stacked on the hole-injection layer.

The hole-injection layer and the hole-transporting layer may be formed over an entire surface of the substrate by the solution process, similar to the emission layer, and the electron-transporting layer and the electron-injection layer may be formed over the entire surface of the substrate by the deposition process.

The hole-injection layer may be made of, for example, copper phthalocyanine(CuPc), N,N-diphenyl-N,N-di[4-(N,N-ditolil-amino)phenyl]benzidine (NTNPB), (poly 3 and 4-ethylenedioxythiophene) (PEDOT), polyaniline(PANI), or N,N-diphenyl-N,N-di-[4-(N,N-diphenyl-amino)phenyl] benzidine (NPNPB).

The hole-transporting layer may be made of, for example, N,N-dinaphthyl-N,N'-diphenyl benzidine (NPD), 4,4',4"-Tris (N-3-methylphenyl-N-phenyl-amino)-triphenylamine (MTDATA), N,N'-bis(naphthalen-1-yl]-N,N'-bis(phenyl)-benzidine (NPB), or N,N'-bis (3-methylphenyl)-N,N'-bis (phenyl) (TPD).

The electron-transporting layer and the electron-injection layer may be made of, for example, one or more of Alq3(tris (8-hydroxyquinolino)aluminum), PBD, TAZ, spiro-PBD, BAlq, SAlq, 2,9-dimethyl-4,7-diphenyl-1,10-phenanthroline(BCP), or 4,7-diphenyl-1,10-phenanthroline(Bphen).

The emission layer may be made of an organic material having a low molecular weight or an organic material having a high molecular weight depending on a position at which it is formed, such as the bending region (BA) (See FIG. 1) or the non-bending regions FA1 and FA2 (See FIG. 1).

A material on which the deposition process may be performed may be used as the organic material having a low molecular weight, and the emission layer may include, for example, a phosphorescent host, a fluorescent host, a phosphorescent dopant, and a fluorescent dopant.

Examples of materials that may be used as hosts include, for example, (4,4'-bis(carbazol-9-yl)biphenyl) (CBP), (9,10-Di(naphth-2-yl) anthracene) (ADN), 1,3,5-tris(N-phenyl-benzimiazole-2-yl)benzene(TPBI), 2-tert-butyl-9,10-di (2-naphthyl)anthracene (TBADN), 1,3-bis(carbazol-9-yl) benzene (MCP), and 1,3,5-tris(carbazol-9-yl)benzene (TCP).

Examples of materials that may be used as a red dopant include, for example, Pt (II) octaethylporphine (PtOEP), Tris (1-phenylisoquinoline) iridium(III) (Ir(piq)$_3$), and Bis (2-benzo[b]thiophen-2-yl-pyridine(Ir(btp)$_2$(acac)).
Examples of materials that may be used as a green dopant include, for example, Tris (2-phenylpyridine)iridium(Ir (ppy)$_3$) and acetylacetonatobis (2-phenylpyridine)iridium(Ir (ppy)$_2$(acac)). Examples of materials that may be used as a blue dopant include, for example, bis[2-(4,6-difluorophenyl) pyridinato-N,C2']iridium picolinate (F$_2$Irpic), (F$_2$ppy)$_2$Ir (tmd), tris[1-(4,6-difluorophenyl)pyrazolate-N,C2']iridium) (Ir(dfppz)$_3$), 4,4'-Bis (2,2-diphenylvinyl)-1,1'-biphenyl) (DPVBi), 4,4-Bis[4-(di-p-tolylamino)styryl]biphenyl (DPAVBi), and 2,5,8,11-Tetra-tert-butylperylene (TBPe).

The organic material having a high molecular weight, which may be a material having a high solubility, may be a material on which the solution process may be performed, for example, a polyfluorene derivative, a (poly)paraphenylenevinylene derivative, a polyphenylene derivative, polyvinylcarbazole, a polythiophene derivative, or compounds obtained by doping polymer materials thereof with a perylene based pigment, a cumarine based pigment, a rhodamine based pigment, rubrene, perylene, 9,10-diphenylanthracene, tetraphenylbutadiene, Nile red, coumarin, or quinacridone.

The emission layer may include a red emission layer emitting red light, a green emission layer emitting green light, and a blue emission layer emitting blue light, and the red emission layer, the green emission layer, and the blue emission layer may be formed in a red pixel, a green pixel, and a blue pixel, respectively, to implement a color image.

The red emission layer, the green emission layer, and the blue emission layer may be stacked as the emission layer in all of the red pixel, the green pixel, and the blue pixel, and a red color filter, a green color filter, and a blue color filter may be formed in each pixel, and a color image may be implemented. As another example, a white emission layer emitting white light may be formed in all of the red pixel, the green pixel, and the blue pixel, and a red color filter, a green color filter, and a blue color filter may be formed in each pixel, and a color image may be implemented. When the color image is implemented using the white emission layer and the color filter, deposition masks for depositing the red emission layer, the green emission layer, and the blue emission layer on the respective individual pixels, for example, the red pixel, the green pixel, and the blue pixel may not need to be used.

The white emission layer may be formed of one emission layer emitting white light. In an embodiment, emission layers emitting light having a plurality of different colors may be stacked to emit white light. For example, the emission layer may include a configuration enabling white light emission by a combination of at least one yellow emission layer and at least one blue emission layer, a configuration enabling white light emission by a combination of at least one cyan emission layer and at least one red emission layer, a configuration enabling white light emission by a combination of at least one magenta emission layer and at least one green emission layer.

A second electrode 730, which may be the cathode of FIGS. 4 and 5, may be formed on the pixel definition layer 190 and the organic emission layer 720.

The first electrode 710, the organic emission layer 720, and the second electrode 730 may configure the organic light emitting diode LD.

The organic light emitting diode display device may have a top display type structure, a bottom display type structure, or a double-sided display type structure, depending on a direction in which the organic light emitting diode LD emits light.

When the organic light emitting diode has a top display type structure, the first electrode 710 may be formed of a reflecting layer, and the second electrode 730 may be formed of a transflective layer or a transmitting layer. In an embodiment, when the organic light emitting diode has a bottom display type structure, the first electrode 710 maybe formed of a transflective layer, and the second electrode 730 may be formed of a reflecting layer. When the organic light emitting diode has a double-sided display type structure, the first electrode 710 and the second electrode 730 may be formed of a transparent layer or a translucent layer.

The reflecting layer or the translucent layer may be made of one or more of magnesium (Mg), silver (Ag), gold (Au), calcium (Ca), lithium (Li), chromium (Cr), and aluminum (Al), or an alloy thereof. The reflecting layer and the transflective layer may be determined by their thicknesses, and the transflective layer may be formed at a thickness of 200 nm or less. The thinner the thickness of the transflective layer, the higher the transmittance may be. When the thickness of the transflective layer is excessively thin, a resistance may be increased.

The transparent layer may be formed of a material such as, for example, an indium tin oxide (ITO), an indium zinc oxide (IZO), a zinc oxide (ZnO), or an indium oxide ($In_2O_3$).

A capping layer 270 may be formed on the second electrode. The capping layer 270, which may increase light emitting efficiency using a thickness and a refractive index, may be made of a material having a high refractive index of 1.5 or more.

An encapsulation layer 260 may be formed on the capping layer 270.

An encapsulation layer 260 may include one or more organic layer and one or more inorganic layer that are alternately formed. The numbers of organic layers and inorganic layers may be plural, respectively.

The organic layer may be formed of polymer, and may be a single layer or a stacked layer formed of polyethylene terephthalate, polyimide, polycarbonate, epoxy, polyethylene, or polyacrylate. For example, the organic layer may be formed of polyacrylate. The organic layer may include a polymerized monomer composition including a diacrylate based monomer and a triacrylate based monomer. A monoacrylate based monomer may be further included in the monomer composition. In an embodiment, a photo-initiator such as trimethylbenzoyl diphenylphosphine oxide (TPO) may be further included in the monomer composition.

The inorganic layer may be a single layer or a stacked layer including a metal oxide or a metal nitride. The inorganic layer may include $SiN_x$, $Al_2O_3$, $SiO_2$, or $TiO_2$.

The uppermost layer exposed to the outside in the encapsulation layer may be an organic layer to prevent permeation of moisture into the organic light emitting diode.

The encapsulation layer may include at least one sandwich structure in which at least one organic layer is inserted between at least two inorganic layers. The encapsulation layer may include one sandwich structure in which at least one inorganic layer is inserted between at least two organic layers.

As described above, damage to pixels in the bending region, for example, due to a repetitive bending operation, may be minimized when the emission layer made of the organic material having a high molecular weight is formed in the bending region as in an exemplary embodiment of the present disclosure as compared with when the emission layer is made of the organic material having a low molecular weight.

The organic material having the high molecular weight may be more robust to stress, for example, due to the bending operation, than the organic material having the low molecular weight, and, for example, a crack, may be not generated even though the bending operation is repeated. A phenomenon that stress may be concentrated in the bending region, for example, due to the repetitive bending operation, to damage the bending region, may be decreased.

Figure 6:
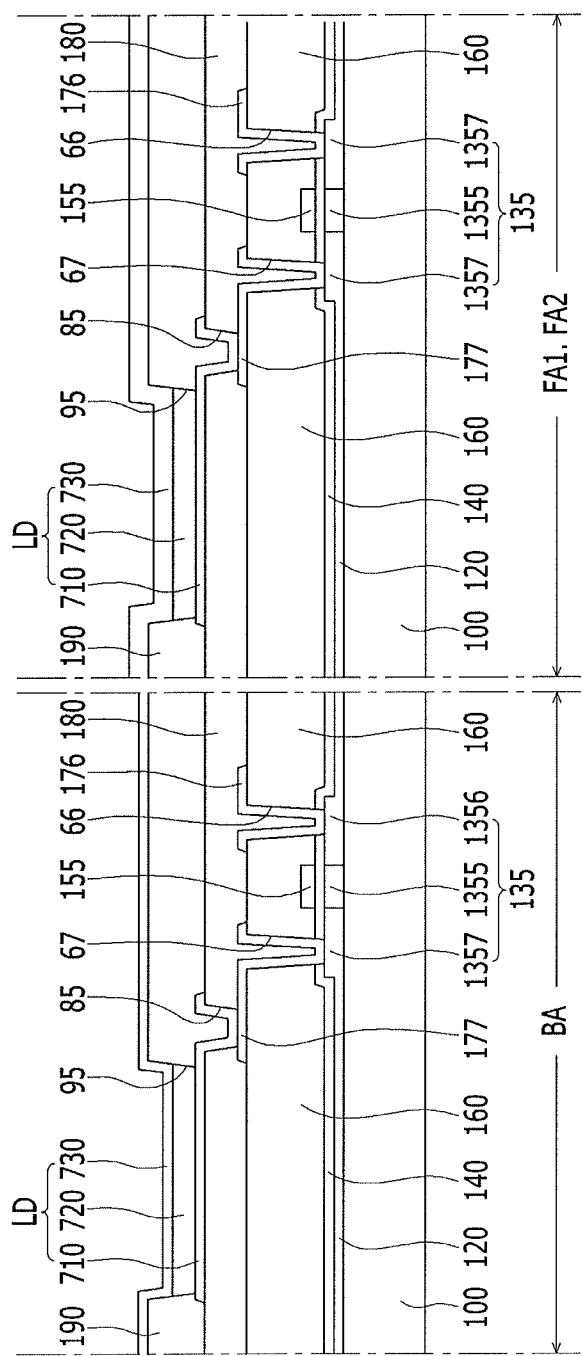
FIG. 6 illustrates a cross-sectional view of an organic light emitting diode display device according to an exemplary embodiment of the present disclosure.

FIG. 6 illustrates a cross-sectional view of an organic light emitting diode display device according to an exemplary embodiment of the present disclosure.

Since most of the organic light emitting diode display device of FIG. 6 is the same as that of the organic light emitting diode display device of FIG. 5, only configurations different from those of FIG. 5 will be described in detail.

As shown in FIG. 6, the organic light emitting diode display device according to an exemplary embodiment of the present disclosure may include a substrate 100, a buffer layer 120 formed on the substrate 100, a semiconductor 135 formed on the buffer layer 120, a gate insulating layer 140 formed on the semiconductor 135, a gate electrode 155 formed on the gate insulating layer 140, an interlayer insulating layer 160 formed on the gate electrode 155, a source electrode 176 and a drain electrode 177 formed on the interlayer insulating layer 160, a passivation layer 180 formed on the source electrode 176 and the drain electrode 177, a first electrode 710 formed on the passivation layer 180, a pixel definition layer 190 having an opening 95 exposing the first electrode 710, an emission layer 720 formed in the opening 95 of the pixel definition layer 190, and a second electrode 730 formed on the emission layer 720.

The second electrode 730 may be formed on an upper surface of the substrate 100, and may have different thicknesses in a bending region BA and non-bending regions FA1 and FA2. The second electrode 730 positioned in the bending region BA may be formed at a thickness thicker than that of the second electrode 730 positioned in the non-bending regions FA1 and FA2.

To make thicknesses of the second electrode 730 in the bending region BA and the non-bending regions FA1 and FA2 different from each other, after a metal layer for the second electrode is formed, portions of the metal layer for the second electrode positioned in the non-bending regions FA1 and FA2 may be etched and removed using, for example, a photolithography process, and it may be possible to decrease the thickness of the second electrode. In an embodiment, after the metal layer for the second electrode is formed, a metal layer may additionally be formed in only the bending region BA using a mask, and it may be possible to form the second electrode 730 positioned in the bending region BA and the second electrode 730 positioned in the non-bending regions FA1 and FA2 at different thicknesses.

Since stress applied to the bending region may be increased in proportion to a thickness, when the second electrode 730 positioned in the bending region BA is formed at a thickness thinner than that of the second electrode 730 positioned in the non-bending regions FA1 and FA2 as in the present disclosure, even though the organic light emitting diode display device is repeatedly bent, damage to the pixels of the bending region BA, for example, due to stress, may be decreased.

By way of summation and review, when a flexible display device is bent or folded, a region bent or folded in regions of the flexible display device may be vulnerable to stress, and, for example, deformation, damage, or characteristic deterioration of the flexible display device may occur.

When a flexible display device is bent or folded, a degradation phenomenon may occur in the folded region, and durability of the flexible display device may be decreased.

Provided is a display device that may improve durability by minimizing a degradation phenomenon in a bending region in spite of a repetitive bending operation.

With the flexible display device according to the present disclosure, durability of the flexible display device and convenience of a user may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a substrate having a bending region and non-bending regions;
first electrodes;
an organic emission layer on the first electrodes; and
second electrodes on the organic emission layer,
wherein a molecular weight of organic materials of the organic emission layer positioned in the bending region of the substrate is higher than those of organic materials of the organic emission layer positioned in the non-bending regions of the substrate,
wherein the organic materials of the organic emission layer positioned in the bending region of the substrate comprise at least one of a polyfluorene derivative, a (poly)paraphenylenevinylene derivative, a polyphenylene derivative, polyvinylcarbazole, a polythiophene derivative, poly (3,4-ethylenedioxythiophene):polystyrene sulfonate (PEDOT:PSS), polyanilin (PANI), polypyrrole, or compounds obtained by doping polymer materials thereof with a perylene based pigment, a cumarine based pigment, a rhodamine based pigment, rubrene, perylene, 9,10-diphenylanthracene, tetraphenylbutadiene, Nile red, coumarin and quinacridone, and
wherein the organic materials of the organic emission layer positioned in the non-bending regions of the substrate comprises at least one of (4,4'-bis(carbazol-9-yl)biphenyl) (CBP), (9,10-Di(naphth-2-yl) anthracene) (ADN), 1,3,5-tris(N-phenylbenzimiazole-2-yl) benzene(TPBI), 2-tert-butyl-9,10-di (2-naphthyl) anthracene (TBADN), 1,3-bis(carbazol-9-yl)benzene (MCP), and 1,3,5-tris(carbazol-9-yl)benzene (TCP).

2. The display device as claimed in claim 1, wherein the bending region is a region folded or bent based on a reference line.

3. The display device as claimed in claim 1, wherein:
the non-bending regions include first and second non-bending regions, and
the first and second non-bending regions are at opposite sides of the bending region.

4. The display device as claimed in claim 1, wherein:
an emission layer of the bending region is formed by a solution process, and
an emission layer of the non-bending regions is formed by a deposition process.

5. The display device as claimed in claim 1, wherein the organic emission layer includes a hole-injection layer, a hole-transporting layer, an emission layer, an electron-transporting layer, and an electron-injection layer.

6. The display device as claimed in claim 5, wherein the hole-injection layer, the hole-transporting layer, the electron-transporting layer, and the electron-injection layer are over an entirety of the substrate.

7. The display device as claimed in claim 1, wherein, among the second electrodes, a second electrode in the bending region and a second electrode in the non-bending regions have different thicknesses.

8. The display device as claimed in claim 7, wherein the second electrode in the bending region has a thinner thickness than a thickness of the second electrode in the non-bending regions.

9. A display device, comprising:
a substrate having a bending region and non-bending regions;
first electrodes;
an organic emission layer on the first electrodes; and
second electrodes on the organic emission layer,
wherein, among the second electrodes, a second electrode in the bending region has a thinner thickness than a thickness of a second electrode in the non-bending regions
wherein the organic materials of the organic emission layer positioned in the bending region of the substrate comprises at least one of a polyfluorene derivative, a (poly)paraphenylenevinylene derivative, a polyphenylene derivative, polyvinylcarbazole, a polythiophene derivative, poly (3,4-ethylenedioxythiophene):polystyrene sulfonate (PEDOT:PSS), polyanilin (PANI), polypyrrole, or compounds obtained by doping polymer materials thereof with a perylene based pigment, a cumarine based pigment, a rhodamine based pigment, rubrene, perylene, 9,10-diphenylanthracene, tetraphenylbutadiene, Nile red, coumarin and quinacridone, and
wherein the organic materials of the organic emission layer positioned in the non-bending regions of the substrate comprises at least one of (4,4'-bis(carbazol-9-yl)biphenyl) (CBP), (9,10-Di(naphth-2-yl) anthracene) (ADN), 1,3,5-tris(N-phenylbenzimiazole-2-yl) benzene(TPBI), 2-tert-butyl-9,10-di (2-naphthyl) anthracene (TBADN), 1,3-bis(carbazol-9-yl)benzene (MCP), and 1,3,5-tris(carbazol-9-yObenzene (TCP).

10. The display device as claimed in claim 9, wherein the bending region is a region folded or bent based on a reference line.

11. The display device as claimed in claim 10, wherein:
the non-bending regions include first and second non-bending regions, and
the first and second non-bending regions are at opposite sides of the bending region.

* * * * *